United States Patent
Wang et al.

(10) Patent No.: US 10,355,444 B2
(45) Date of Patent: Jul. 16, 2019

(54) MEDIA ACCESS CONTROL MAC CHIP AND TERMINAL DEVICE

(71) Applicant: ZTE CORPORATION, Shenzhen, Guangdong Province (CN)

(72) Inventors: Ying Wang, Shenzhen (CN); Zhiming Fu, Shenzhen (CN); Mingsheng Li, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 198 days.

(21) Appl. No.: 15/548,417

(22) PCT Filed: Jan. 18, 2016

(86) PCT No.: PCT/CN2016/071230
§ 371 (c)(1),
(2) Date: Aug. 23, 2017

(87) PCT Pub. No.: WO2016/124076
PCT Pub. Date: Aug. 11, 2016

(65) Prior Publication Data
US 2018/0026420 A1    Jan. 25, 2018

(30) Foreign Application Priority Data

Feb. 5, 2015 (CN) .......................... 2015 2 0082348

(51) Int. Cl.
*H01S 5/026* (2006.01)
*H04B 10/40* (2013.01)
(Continued)

(52) U.S. Cl.
CPC .......... *H01S 5/0261* (2013.01); *G01J 1/0209* (2013.01); *G01J 1/44* (2013.01); *H01L 27/12* (2013.01);
(Continued)

(58) Field of Classification Search
CPC .. H01S 5/0261; H01S 5/02248; H01S 5/0226; H01S 5/3013; H04B 10/40; G01J 1/0209; G01J 1/44; H01L 27/12
(Continued)

(56) References Cited

U.S. PATENT DOCUMENTS

| 5,636,140 A | * | 6/1997 | Lee ......................... H04L 29/06 |
| | | | 370/349 |
| 6,631,138 B1 | * | 10/2003 | Findlater ............... H04J 3/0697 |
| | | | 370/446 |

(Continued)

FOREIGN PATENT DOCUMENTS

| CN | 204391113 U | 6/2015 |
| WO | 2014014846 A2 | 1/2014 |

*Primary Examiner* — Seung C Sohn
(74) *Attorney, Agent, or Firm* — Ling Wu; Stephen Yang; Ling and Yang Intellectual Property

(57) ABSTRACT

The present disclosure discloses a Media Access Control (MAC) chip and a terminal device. The MAC chip includes a silicon substrate layer (1), a silicon dioxide base layer (2) formed on a surface of the silicon substrate layer (1), and a silicon base layer (3) formed on a surface, away from the silicon substrate layer, of the silicon dioxide base layer (1); and an element layer (4) formed on a surface, away from the silicon dioxide base layer (2), of the silicon base layer (3), and herein the element layer (4) includes a laser (41), a passive device (42), a detector (43), a drive circuit (44) and an MAC chip body (45), herein the drive circuit (44) is respectively connected with the laser (41), the detector (43) and the MAC chip body (45), and the laser (41) is connected with the detector (43) through the passive device (42).

16 Claims, 1 Drawing Sheet

(51) Int. Cl.
*H01L 27/12* (2006.01)
*G01J 1/02* (2006.01)
*G01J 1/44* (2006.01)
*H01S 5/022* (2006.01)
*H01S 5/30* (2006.01)

(52) U.S. Cl.
CPC ........ *H01S 5/0226* (2013.01); *H01S 5/02248* (2013.01); *H04B 10/40* (2013.01); *H01S 5/3013* (2013.01)

(58) Field of Classification Search
USPC .......................................................... 398/135
See application file for complete search history.

(56) References Cited

U.S. PATENT DOCUMENTS

| | | |
|---|---|---|
| 2008/0001262 A1 | 1/2008 | Kmgaing |
| 2008/0191598 A1 | 8/2008 | Yang et al. |
| 2009/0304384 A1 | 12/2009 | Li |
| 2015/0030333 A1 | 1/2015 | Sun et al. |

* cited by examiner

MEDIA ACCESS CONTROL MAC CHIP AND TERMINAL DEVICE

TECHNICAL FIELD

The present disclosure relates to but not limited to the field of optical communication.

BACKGROUND

With the development trend that high-rate and high-bandwidth optical communication systems need to further decrease power consumption, reduce the size and reduce the cost, miniaturization and integration of key components in the optical communication systems are increasingly concerned by people.

However, a terminal device of an optical communication system in the existing art consists of an optical transceiver module, a traditional Media Access Control (MAC) chip and a peripheral circuit, and the size of the terminal device is relatively large, and the power consumption is high and the cost is very difficult to be reduced.

SUMMARY

What is described below is a summary of the subject described in detail in this disclosure. This summary is not used for limiting the protection scope of the claims.

This disclosure provides a Media Access Control (MAC) chip and a terminal device, which solve the problems that the terminal device of the optical communication system in the existing art has a large size, a high power consumption and a cost difficult to be reduced.

An embodiment of the present disclosure provides a Media Access Control (MAC) chip, including:

a silicon substrate layer, a silicon dioxide base layer formed on a surface of the silicon substrate layer and a silicon base layer formed on a surface, away from the silicon substrate layer, of the silicon dioxide base layer; and an element layer formed on a surface, away from the silicon dioxide base layer, of the silicon base layer, herein the element layer includes a laser, a passive device, a detector, a drive circuit and an MAC chip body;

herein the drive circuit is respectively connected with the laser, the detector and the MAC chip body, and the laser is connected with the detector through the passive device.

In an exemplary embodiment, the laser is an III-V laser.
In an exemplary embodiment, the drive circuit includes:
a laser drive circuit respectively connected with the MAC chip body and the laser.

In an exemplary embodiment, the drive circuit further includes:

an amplification circuit connected with the detector; and
a filter circuit respectively connected with the MAC chip body and the amplification circuit.

In an exemplary embodiment, the passive device, the detector, the drive circuit and the MAC chip body are respectively formed on the silicon base layer by adopting a silicon material growth mode.

In an exemplary embodiment, the laser is formed on the silicon base layer by adopting a bonding mode.

In an exemplary embodiment, the silicon dioxide base layer is formed on the silicon substrate layer by adopting a silicon material growth mode; and the silicon base layer is formed on the silicon dioxide base layer by adopting the silicon material growth mode.

In an exemplary embodiment, the laser, the passive device, the detector, the drive circuit and the MAC chip body are uniformly distributed on the silicon base layer according to a preset mode.

An embodiment of the present disclosure further provides a terminal device including the above-mentioned MAC chip.

The MAC chip provided by the embodiment of the present disclosure includes the silicon substrate layer, the silicon dioxide base layer, the silicon base layer and the element layer which are sequentially formed from bottom to top. Herein, the element layer includes the laser, the passive device, the detector, the drive circuit and the MAC chip body. The drive circuit is respectively connected with the laser, the detector and the MAC chip body, and the laser is connected with the detector through the passive device. The laser, the passive device, the detector and the drive circuit jointly form an optical transceiver function of the MAC chip, and therefore a novel MAC chip having a self-contained optical transceiver function is formed, such that the terminal device including the novel MAC chip does not need to be separately provided with an optical transceiver module, thereby reducing the size of the terminal device including the novel MAC chip, decreasing the device power consumption and reducing the production cost is reduced.

After the drawings and the detailed description are read and understood, other aspects can be understood.

DESCRIPTION OF REFERENCE SIGNS

1—silicon substrate layer, 2—silicon dioxide base layer, 3—silicon base layer, 4—element layer, 41—laser, 42—passive device, 43—detector, 44—drive circuit, 441—laser drive circuit, 442—amplification circuit, 443—filter circuit, 45—MAC chip body, 5—external service interface module

DETAILED DESCRIPTION

Embodiments of the present disclosure will be described below with reference to the drawings.

According to a Media Access Control (MAC) chip provided by an embodiment of the present disclosure, an optical transceiver module and a traditional MAC chip are integrated together, and a novel MAC chip having a self-contained optical transceiver function is formed by using a silicon base hybrid integration mode, therefore the problems that the terminal device in the existing art has a large size, a high power consumption and a cost difficult to be reduced are solved.

Figure 1:
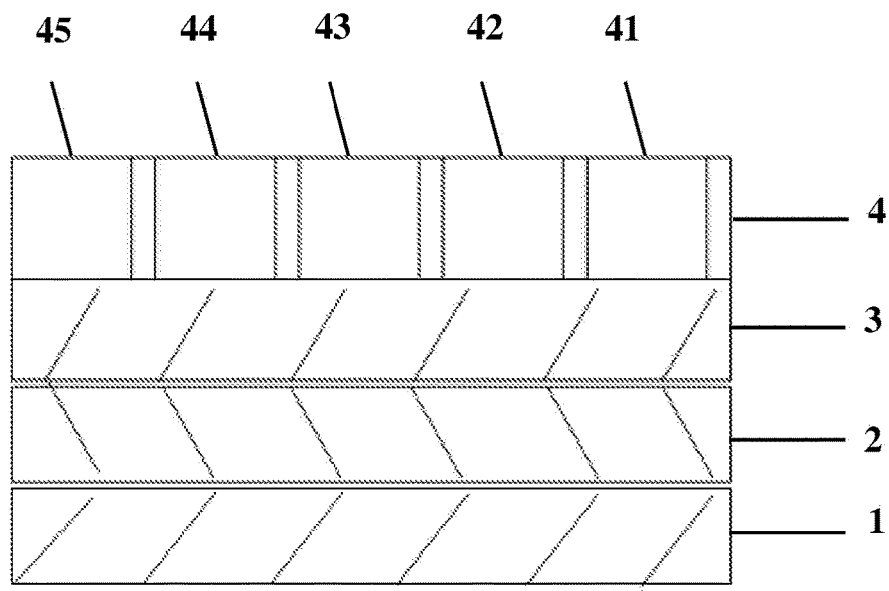
FIG. 1 illustrates a structural schematic diagram of a Media Control Access (MAC) chip according to an embodiment of the present disclosure.
Figure 2:
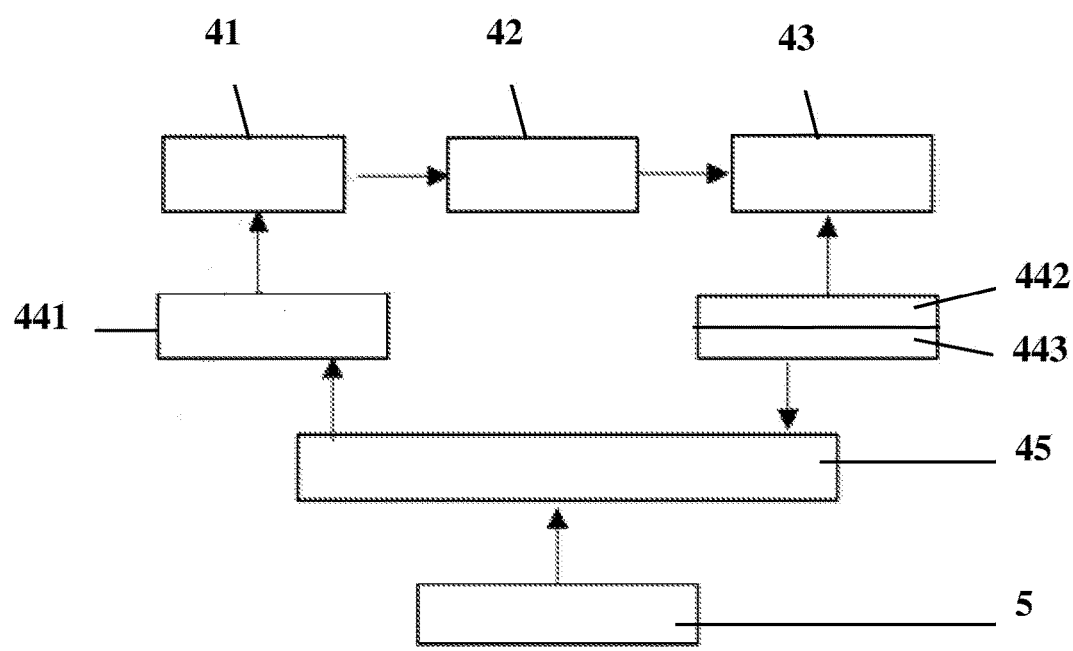
FIG. 2 illustrates a structural schematic diagram of an element layer of an MAC chip according to an embodiment of the present disclosure.

As illustrated in FIGS. 1-2, the MAC chip provided by an embodiment of the present disclosure includes:

a silicon substrate layer 1, a silicon dioxide base layer 2 formed on a surface of the silicon substrate layer 1 and a silicon base layer 3 formed on a surface, away from the silicon substrate layer 1, of the silicon dioxide base layer 2; and an element layer 4 formed on a surface, away from the silicon dioxide base layer 2, of the silicon base layer 3;

herein the element layer 4 includes a laser 41, a passive device 42, a detector 43, a drive circuit 44 and an MAC chip body 45.

Herein, the drive circuit 44 is respectively connected with the laser 41, the detector 43 and the MAC chip body 45, and the laser 41 is connected with the detector 43 through the passive device 42.

The MAC chip provided by the embodiment of the present disclosure adopts a Complementary Metal Oxide Semiconductor (CMOS) process. Firstly the silicon dioxide base layer 2, the silicon base layer 3 are formed sequentially on the silicon substrate layer 1 from bottom to top, and then the element layer 4 is formed on the silicon base layer 3. Herein, the laser 41, the passive device 42, the detector 43 and the drive circuit 44 on the element layer 4 jointly form an optical transceiver function of the MAC chip. Therefore, a novel MAC chip having a self-contained optical transceiver function is formed, such that the terminal device including the novel MAC chip does not need to be separately provided with an optical transceiver module, thereby reducing the size of the terminal device including the novel MAC chip, decreasing the device power consumption and reducing the production cost.

Herein, the MAC chip body 45 is connected with an external service interface module 5 to perform service interaction with the external service interface module 5.

In an embodiment of the present disclosure, the laser 41 is an III-V laser.

Herein, the drive circuit 44 may include:

a laser drive circuit 441 respectively connected with the MAC chip body 45 and the laser 41.

At this moment, the laser drive circuit 441 may control the laser 41 to work according to a signal transmitted by the MAC chip body 45, to realize an optical transceiver function of the MAC chip.

The drive circuit 44 may further include:

an amplification circuit 442 connected with the detector 43; and a filter circuit 443 respectively connected with the MAC chip body 41 and the amplification circuit 442.

At this moment, the signal of the laser 41 detected by the detector 43 may have interference information, and the signal detected by the detector may be amplified and filtered through the amplification circuit 442 and the filter circuit 443 to make the signal be restored, and then the restored signal is transmitted to the external service interface module 5 through the MAC chip body 45.

In an exemplary embodiment, the passive device 42, the detector 43, the drive circuit 44 and the MAC chip body 45 are respectively formed on the silicon base layer 3 by adopting a silicon material growth mode.

At this moment, the passive device 42, the detector 43, the drive circuit 44 and the MAC chip body 45 are well bonded with the silicon base layer 3, and the stability is increased.

Since the laser 41 cannot be formed on the silicon base layer 3 by adopting the silicon material growth mode, the laser 41 is formed on the silicon base layer 3 by adopting a bonding method. The good bonding between the laser 41 and the silicon base layer 3 is also realized.

In an exemplary embodiment, the silicon dioxide base layer 2 is formed on the silicon substrate layer 1 by adopting the silicon material growth mode; and the silicon base layer 3 is formed on the silicon dioxide base layer 2 by adopting the silicon material growth mode.

The laser 41, the passive device 42, the detector 43, the drive circuit 44 and the MAC chip body 45 are uniformly distributed on the silicon base layer 3 according to a preset mode.

The embodiment of the present disclosure will be described below with examples.

The MAC chip provided by the embodiment of the present disclosure adopts a CMOS process. Firstly a silicon dioxide base layer 2 and a silicon base layer 3 are sequentially formed on a silicon substrate layer 1 from bottom to top, and then an element layer 4 is formed on the silicon base layer 3. The element layer 4 includes an III-V laser, a passive device 42, a detector 43, a drive circuit 44 and an MAC chip body 45 which are uniformly distributed according to a preset mode. The drive circuit 44 includes a laser drive circuit 441, an amplification circuit 442 and a filter circuit 443. Herein, the passive device 42, the detector 43, the drive circuit 44 and the MAC chip body 45 are formed on the silicon base layer 3 by adopting the silicon material growth mode, and the III-V laser is formed on the silicon base layer 3 by adopting a bonding mode. The III-V laser is connected with the detector 43 through the passive device 42, and the MAC chip body 45 is connected with an external service interface module 5, and the laser drive circuit 441 is respectively connected with the MAC chip body 45 and the III-V laser, and the amplification circuit 442 is connected with the detector 43, and the filter circuit 443 is respectively connected with the MAC chip body 45 and the amplification circuit 442. The III-V laser, the passive device 42, the detector 43 and the drive circuit 44 jointly form an optical transceiver function of the MAC chip, therefore a novel MAC chip having a self-contained optical transceiver function is formed, such that the terminal device including the novel MAC chip does not need to be separately provided with an optical transceiver module, thereby reducing the size of the terminal device including the novel MAC chip, decreasing the device power consumption and reducing the production cost.

According to the MAC chip provided by the embodiment of the present disclosure, an optical transceiver module and a traditional MAC chip are integrated together, and a novel MAC chip is formed by using a silicon base hybrid integration mode. Therefore, not only can the size of the original terminal device be reduced, but also the device power consumption is decreased. In addition, a space is provided for reducing the cost of the device, and the application prospect is very great.

Since the MAC chip provided by the embodiment of the present disclosure is applied to a terminal device, an embodiment of the present disclosure further provides a terminal device including the MAC chip in the above-mentioned embodiments. Herein, the implementation examples of the MAC chip are all applicable to embodiments of the terminal device, and the same technical effect can also be achieved.

INDUSTRIAL APPLICABILITY

In embodiments of the present disclosure, the laser, the passive device, the detector and the drive circuit jointly form an optical transceiver function of the MAC chip, and a novel MAC chip having a self-contained optical transceiver function is formed, such that the terminal device including the novel MAC chip does not need to be separately provided with an optical transceiver module, thereby reducing the size of the terminal device including the novel MAC chip, decreasing the device power consumption and reducing the production cost.

What we claim is:

1. A Media Access Control, MAC, chip, comprising:
   a silicon substrate layer, a silicon dioxide base layer formed on a surface of the silicon substrate layer and a silicon base layer formed on a surface, away from the silicon substrate layer, of the silicon dioxide base layer; and
   an element layer formed on a surface, away from the silicon dioxide base layer, of the silicon base layer, wherein the element layer comprises a laser, a passive device, a detector, a drive circuit and an MAC chip body;
   wherein the drive circuit is respectively connected with the laser, the detector and the MAC chip body, and the laser is connected with the detector through the passive device.

2. The MAC chip according to claim 1, wherein the laser is an III-V laser.

3. The MAC chip according to claim 1, wherein the drive circuit comprises:
   a laser drive circuit respectively connected with the MAC chip body and the laser.

4. The MAC chip according to claim 3, wherein the drive circuit further comprises:
   an amplification circuit connected with the detector; and
   a filter circuit respectively connected with the MAC chip body and the amplification circuit.

5. The MAC chip according to claim 1, wherein the passive device, the detector, the drive circuit and the MAC chip body are respectively formed on the silicon base layer by adopting a silicon material growth mode.

6. The MAC chip according to claim 1, wherein the laser is formed on the silicon base layer by adopting a bonding mode.

7. The MAC chip according to claim 1, wherein the silicon dioxide base layer is formed on the silicon substrate layer by adopting a silicon material growth mode; and the silicon base layer is formed on the silicon dioxide base layer by adopting the silicon material growth mode.

8. The MAC chip according to claim 1, wherein the laser, the passive device, the detector, the drive circuit and the MAC chip body are uniformly distributed on the silicon base layer according to a preset mode.

9. A terminal device, comprising the MAC chip according to claim 1.

10. A terminal device, comprising the MAC chip according to claim 2.

11. A terminal device, comprising the MAC chip according to claim 3.

12. A terminal device, comprising the MAC chip according to claim 4.

13. A terminal device, comprising the MAC chip according to claim 5.

14. A terminal device, comprising the MAC chip according to claim 6.

15. A terminal device, comprising the MAC chip according to claim 7.

16. A terminal device, comprising the MAC chip according to claim 8.

* * * * *